(12) United States Patent
Hirota et al.

(10) Patent No.: US 11,174,546 B2
(45) Date of Patent: Nov. 16, 2021

(54) FILM FORMATION METHOD

(71) Applicant: KOBE STEEL, LTD., Hyogo (JP)

(72) Inventors: Satoshi Hirota, Takasago (JP); Koichiro Akari, Nagoya (JP)

(73) Assignee: Kobe Steel, Ltd., Hyogo (JP)

(*) Notice: Subject to any disclaimer, the term of this patent is extended or adjusted under 35 U.S.C. 154(b) by 0 days.

(21) Appl. No.: 16/756,454

(22) PCT Filed: Oct. 3, 2018

(86) PCT No.: PCT/JP2018/036995
§ 371 (c)(1),
(2) Date: Apr. 15, 2020

(87) PCT Pub. No.: WO2019/078004
PCT Pub. Date: Apr. 25, 2019

(65) Prior Publication Data
US 2021/0164089 A1 Jun. 3, 2021

(30) Foreign Application Priority Data

Oct. 17, 2017 (JP) .............................. JP2017-200869

(51) Int. Cl.
*C23C 14/34* (2006.01)
*C23C 14/02* (2006.01)
*C23C 14/14* (2006.01)

(52) U.S. Cl.
CPC .......... *C23C 14/345* (2013.01); *C23C 14/022* (2013.01); *C23C 14/14* (2013.01)

(58) Field of Classification Search
CPC ........ C23C 14/02; C23C 14/22; C23C 14/345
(Continued)

(56) References Cited

U.S. PATENT DOCUMENTS 5,306,407 A * 4/1994 Hauzer ................. C23C 14/022
204/192.38
6,503,373 B2 * 1/2003 Eerden .................. C23C 14/024
204/192.12
(Continued)

FOREIGN PATENT DOCUMENTS

EP 0 558 061 A1 9/1993
EP 2 963 145 A1 1/2016
(Continued)

OTHER PUBLICATIONS

Matsue et al. "Residual stress in TiN film deposited by arc ion plating", Thins Solid Films, (1999), pp. 257-260 (Year: 1999).*
(Continued)

*Primary Examiner* — Rodney G McDonald
(74) *Attorney, Agent, or Firm* — Studebaker & Brackett PC

(57) ABSTRACT

Provided is a film formation method that includes: an etching step of etching the surface of the substrate by bringing inert gas ions into collision with the surface of the substrate, the inert gas ions generated in a chamber accommodating the substrate; an implantation step of bringing inert gas ions into collision with metal particles deposited on the surface of the substrate to thereby hit the metal particles into the surface of the substrate while bringing the inert gas ions into collision with a metal target to thereby cause the metal particles to sputter out of the metal target and depositing the metal particles on the surface of the substrate etched in the etching step; and a film formation step of forming the film on the surface of the substrate into which the metal particles have been hit in the implantation step.

6 Claims, 13 Drawing Sheets

(58) Field of Classification Search
USPC .............................. 427/523, 524, 528, 531
See application file for complete search history.

(56) References Cited

U.S. PATENT DOCUMENTS

| | | | |
|---|---|---|---|
| 7,081,186 B2* | 7/2006 | Ehiasarian | ............ C23C 14/022 |
| | | | 204/192.12 |
| 2004/0168637 A1 | 9/2004 | Gorokhovsky | |
| 2012/0114964 A1 | 5/2012 | Honda et al. | |
| 2014/0234616 A1* | 8/2014 | Hultman | ................. C23C 14/35 |
| | | | 428/336 |
| 2015/0299847 A1 | 10/2015 | Hirota et al. | |

FOREIGN PATENT DOCUMENTS

| | | |
|---|---|---|
| JP | S58-181863 A | 10/1983 |
| JP | 2005-068499 A | 3/2005 |
| JP | 2006-009068 A | 1/2006 |
| KR | 10-2010-0080912 A | 7/2010 |

OTHER PUBLICATIONS

Sproul et al.—Abstract—"The effect of target power on the nitrogen partial pressure level and hardness of reactively sputtered titanium nitride coatings", Thin Solid Films, vol. 171, Issue 1, (1989), pp. 171-181. (Year: 1989).*

The extended European search report issued by the European Patent Office dated Apr. 1, 2021, which corresponds to European Patent Application No. 18867991.4-1103 and is related to U.S. Appl. No. 16/756,454.

* cited by examiner

FILM FORMATION METHOD

TECHNICAL FIELD

The present invention relates to a film formation method of forming a film on a surface of a substrate, the film having a higher hardness than that of the substrate.

BACKGROUND ART

It has been conventionally conducted to form a film on a surface of a substrate, the film having a higher hardness than the hardness of the substrate, in order to enhance the hardness of the substrate. However, the higher hardness that the film has than that of the substrate gives a great difference between respective internal stresses of the substrate and the film formed on the surface of the substrate, involving a problem of decrease in adhesion of the film to the substrate.

To solve the above problem, Patent Literature 1 below proposes a technique of forming a film after subjecting a surface of a substrate to ion bombardment processing with inert gas ions. Specifically, the technique recited in Patent Literature 1 below includes forming a film on a surface of a substrate, after removing an oxide film formed on the surface of the substrate, by bringing inert gas ions into collision with the surface of the substrate.

Besides, Patent Literature 2 below discloses interposing a titanium metal film as an intermediate layer between a substrate from which an oxide film on a surface thereof is removed by collision of titanium metal ions with the surface and a diamond-like carbon film as a film.

However, it is difficult to further improve adhesion of a film to a substrate only by removing an oxide film formed on the surface of the substrate as recited in Patent Literature 1.

Besides, the interposition of an intermediate layer between a substrate and a film as recited in Patent Literature 2 requires not only adhesion of the intermediate layer to the substrate but also adhesion of the film to the intermediate layer. This makes it difficult to improve adhesion of a film to a substrate simply by interposition of an intermediate layer between the substrate and the film.

CITATION LIST

Patent Literature

Patent Literature 1: Japanese Unexamined Patent Publication No. 2005-68499
Patent Literature 2: Japanese Patent No. 5682560

SUMMARY OF INVENTION

An object of the present invention is to provide a film formation method which makes it possible to satisfactorily adhere a film to a surface of the substrate, the film having a hardness higher than the hardness of the substrate.

To achieve the above object, the inventor of the present application focuses on affinity of a surface of a substrate with a film. Based on this, provided is a film formation method of forming a film on a surface of a substrate, the film having a hardness higher than the hardness of the substrate, the film formation method including: an etching step of etching the surface of the substrate by bringing inert gas ions into collision with the surface of the substrate, the inert gas ions being generated by electrical discharge with introduction of inert gas into a chamber that accommodates the substrate; an implantation step of bringing the inert gas ions into collision with metal particles, which has been deposited on the surface of the substrate, to implant the metal particles into the surface of the substrate while bringing the inert gas ions into collision with a metal target to cause metal particles to sputter out of the metal target and depositing the metal particles on the surface of the substrate that has been etched in the etching step; and a film formation step of forming the film on the surface of the substrate, into which the metal particles have been implanted in the implantation step.

DESCRIPTION OF EMBODIMENTS

Below will be detailed embodiments of the present invention with reference to the accompanying drawings.

Figure 1:
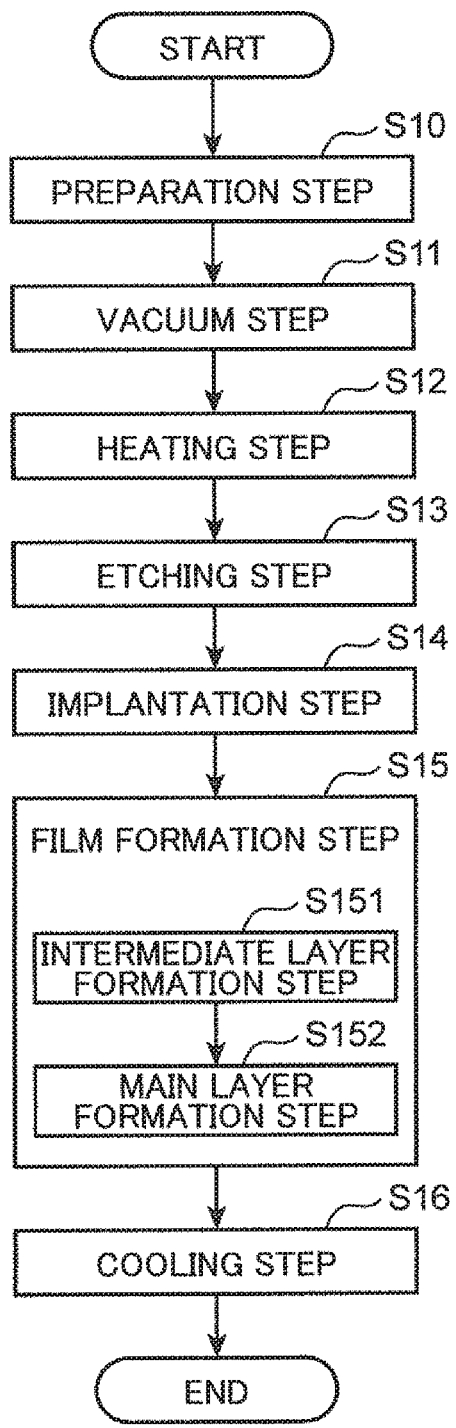
FIG. 1 is a flow chart showing steps of a film formation method according to an embodiment of the present invention.

With reference to FIG. 1, a film formation method according to an embodiment of the present invention will be described. FIG. 1 is a flow chart showing steps of the film formation method according to the embodiment of the present invention.

The film formation method according to the embodiment of the present invention is a method of forming a film on a surface of a substrate, the film having a hardness higher than the hardness of the substrate. The film formation method according to the embodiment of the present invention includes a preparation step (Step S10), a vacuum step (Step S11), a heating step (Step S12), an etching step (Step S13), an implantation step (Step S14), a film formation step (Step S15), and a cooling step (Step S16).

Figure 2:
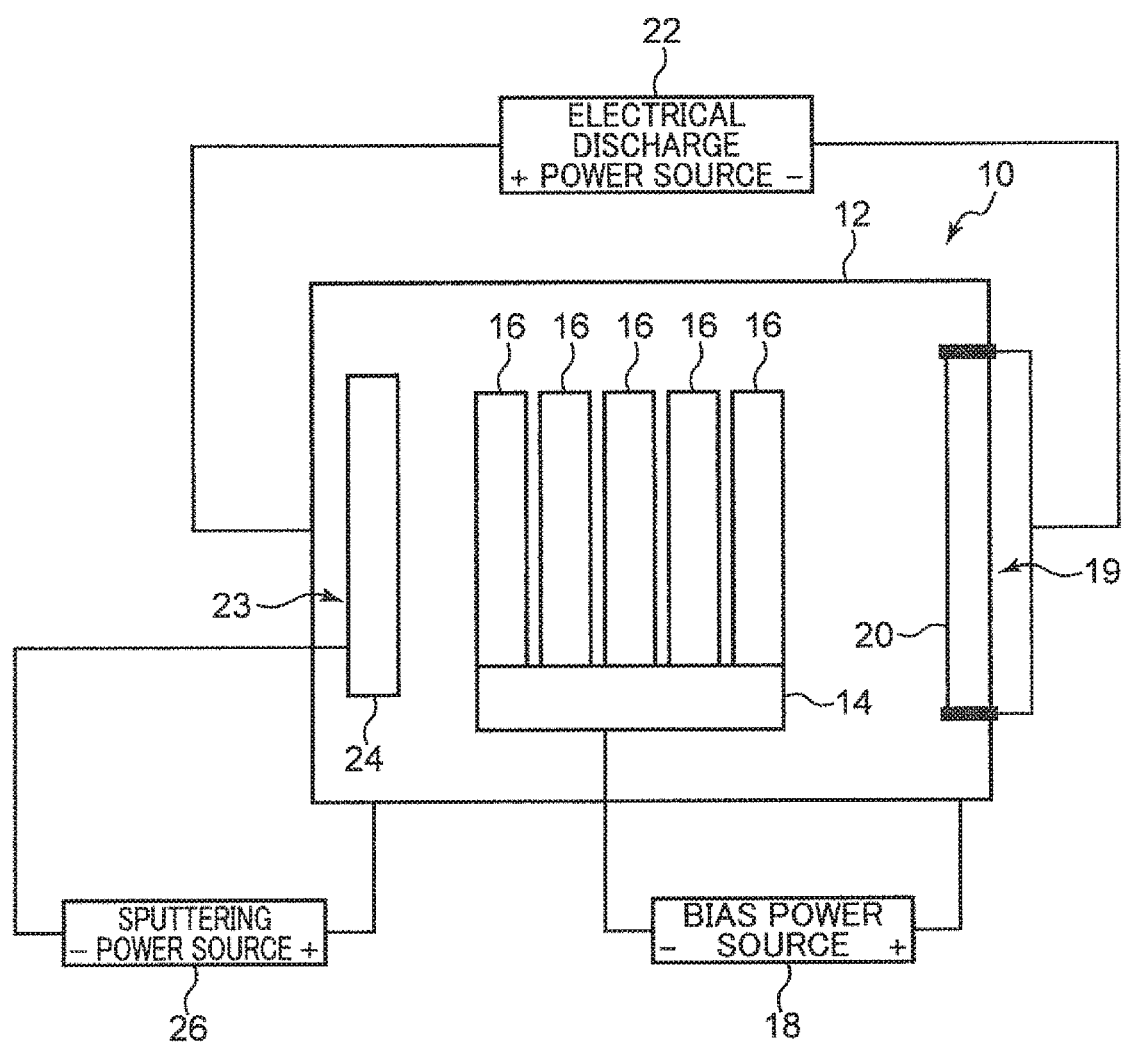
FIG. 2 is a schematic diagram showing a schematic configuration of a film formation device for conducting the film formation method according to the embodiment of the present invention.

The preparation step is a step of setting the substrate to a film formation device 10 shown in FIG. 2. The film formation device 10 is used for executing the film formation method according to the embodiment of the present invention. The film formation device 10 is one example of a film formation device for executing the film formation method according to the embodiment of the present invention. A film formation device for executing the film formation method according to the embodiment of the present invention, therefore, is not limited to the film formation device 10 shown in FIG. 2.

The film formation device 10 includes a vacuum chamber 12, a rotary table 14, a plurality of substrate holders 16, a bias power source 18, a plasma generation device 19, and a sputtering device 23.

The vacuum chamber 12 accommodates the rotary table 14 and the plurality of substrate holders 16, and the plurality of substrate holders 16 are placed on the rotary table 14. The interior of the vacuum chamber 12 (namely, the space in which the rotary table 14 and the plurality of substrate holders 16 are accommodated) is maintained in vacuum or near vacuum by a not-graphically-shown vacuum pump in each of the vacuum step, the heating step, the etching step, the implantation step, and the film formation step. The vacuum chamber 12 has an inlet and an outlet which are not graphically shown. The inlet allows argon gas, which is inert gas to be used in each of the etching step, the implantation step and the film forming step, to be introduced into the vacuum chamber 12 through the inlet and the film formation step. The outlet allows the argon gas to be discharged to the outside of the vacuum chamber 12 through the outlet.

Figure 3:
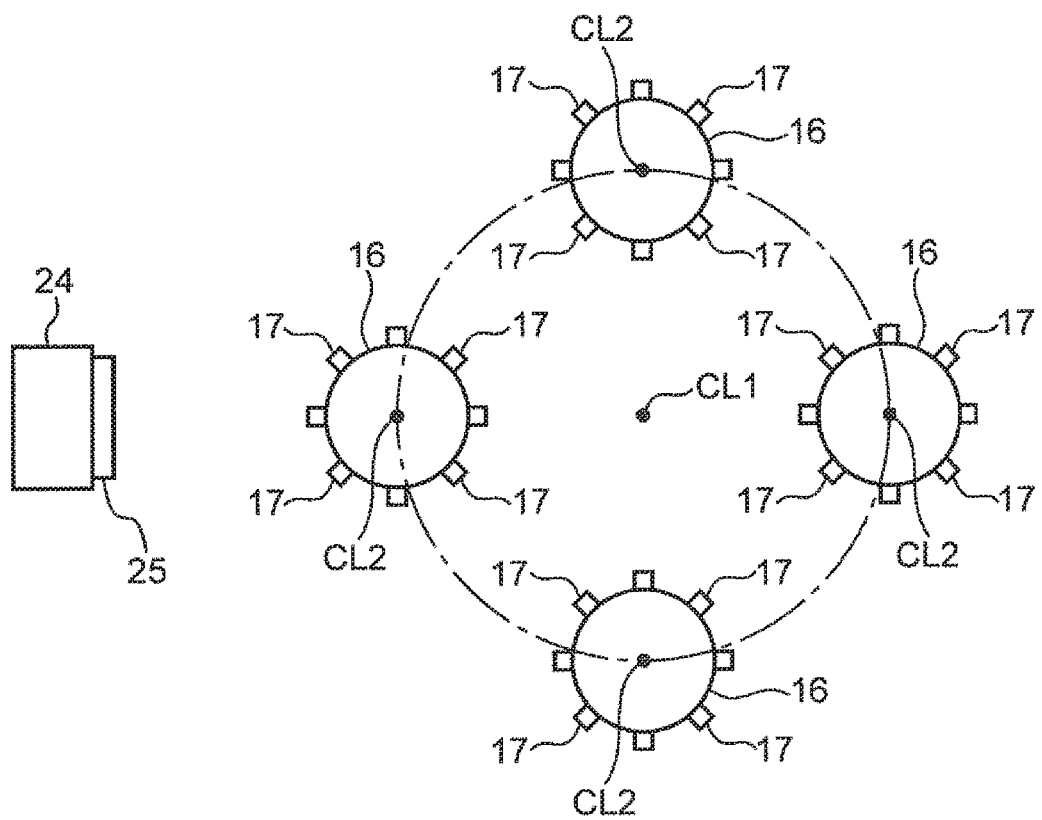
FIG. 3 is a plan view showing a plurality of substrate holders and an evaporation source provided in the film formation device shown in FIG. 2.
Figure 4:
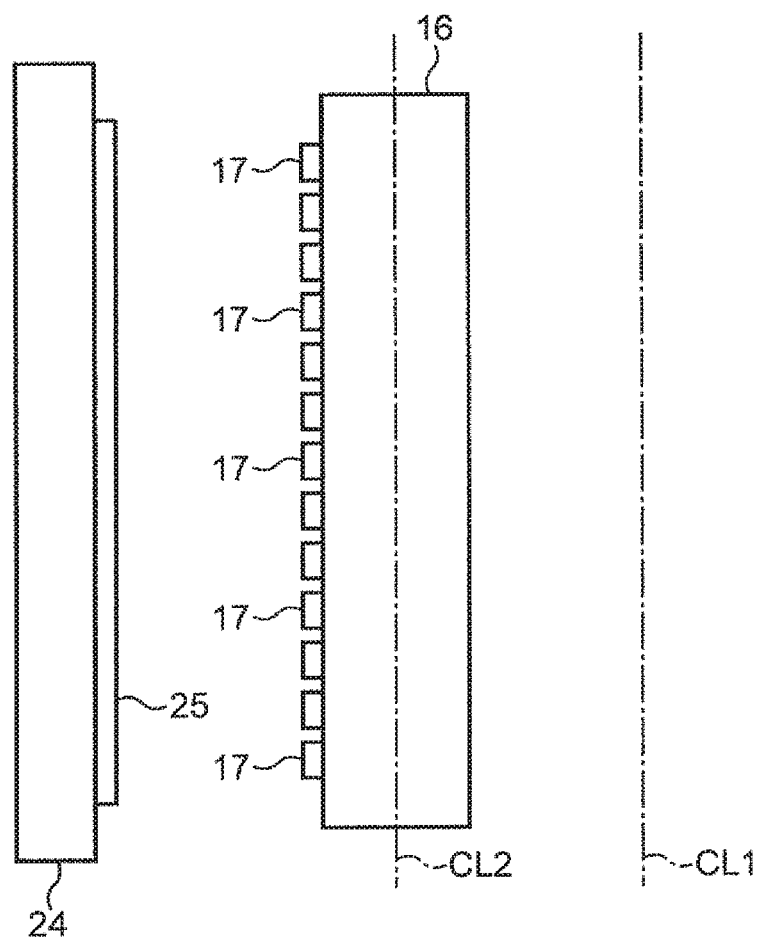
FIG. 4 is a front view showing the plurality of substrate holders and the evaporation source provided in the film formation device shown in FIG. 2.

The rotary table 14 rotates around a central axis CL1 (see FIG. 3 and FIG. 4) of the rotary table 14 as shown in FIG. 3 and FIG. 4 in the vacuum chamber 12, while supporting the plurality of substrate holders 16 on the rotary table 14, in each of the etching step, the implantation step, and the film formation step. The rotary table 14 may further include a plurality of rotary bases on which the plurality of substrate holders 16 are placed, respectively, so as to enable each of the plurality of substrate holders 16 to rotate on its axis.

With reference to FIG. 3 and FIG. 4, the plurality of substrate holders 16 will be described. FIG. 3 and FIG. 4 are a plan view and a front view, respectively, showing a relative positional relation between the plurality of substrate holders 16 and an evaporation source 24.

Each of the plurality of substrate holders 16 supports a plurality of substrates 17. The plurality of substrates 17 are disposed on the outer circumferential surface of each of the substrate holders 16.

The plurality of substrates 17 are supported on the substrate holders 16 so as to be divided into to a plurality of substrate columns. In each of the plurality of substrate columns, some substrates 17 of the plurality of substrates 17 are aligned along the central axis CL2 of the substrate holder 16. The plurality of substrate columns are aligned at an appropriate interval around the central axis CL2 of the substrate holder 16. i.e., in a circumferential direction of the substrate holder 16. In summary, the plurality of substrates 17 are arranged at an appropriate interval in each of a direction in which the central axis CL2 of the substrate holder 16 extends and the circumferential direction around the central axis CL2 of the substrate holder 16. The outer circumferential surface of the substrate holder 16, therefore, is exposed in a region where the plurality of substrates 17 are not arranged, i.e., a region around each of the plurality of substrates 17.

Each of the substrates 17 is formed of an insulating material. The insulating material is, for example, ceramic.

Each of the plurality of substrate holders 16 is formed of a conductive material. The conductive material is, for example, stainless steel.

In the mode shown in FIG. 3, four substrate holders 16 are arranged at an equal interval in the circumferential direction of rotation of the rotary table 14. However, the number of the plurality of substrate holders according to the present invention may be five or more, or three or less. FIG. 4 shows only the closest substrate holder 16 to the evaporation source 24 among the plurality of substrate holders 16 and one substrate column among the plurality of substrate columns formed on the substrate holder 16.

The plurality of substrate holders 16 are arranged at an equal interval in the circumferential direction of the rotary table 14 shown in FIG. 2 (see FIG. 2). The plurality of substrate holders 16 are placed on the rotary table 14 in respective positions where each of the central axis CL2 is parallel to the central axis CL1 of the rotary table 14.

The bias power source 18 shown in FIG. 2 applies a negative bias voltage to each of the plurality of substrate holders 16 through the rotary table 14. The negative bias voltage is applied in each of the etching step, the implantation step, and the film formation step. The absolute value of the negative bias voltage varies with the etching step, the implantation step, and the film formation step.

Figure 5:
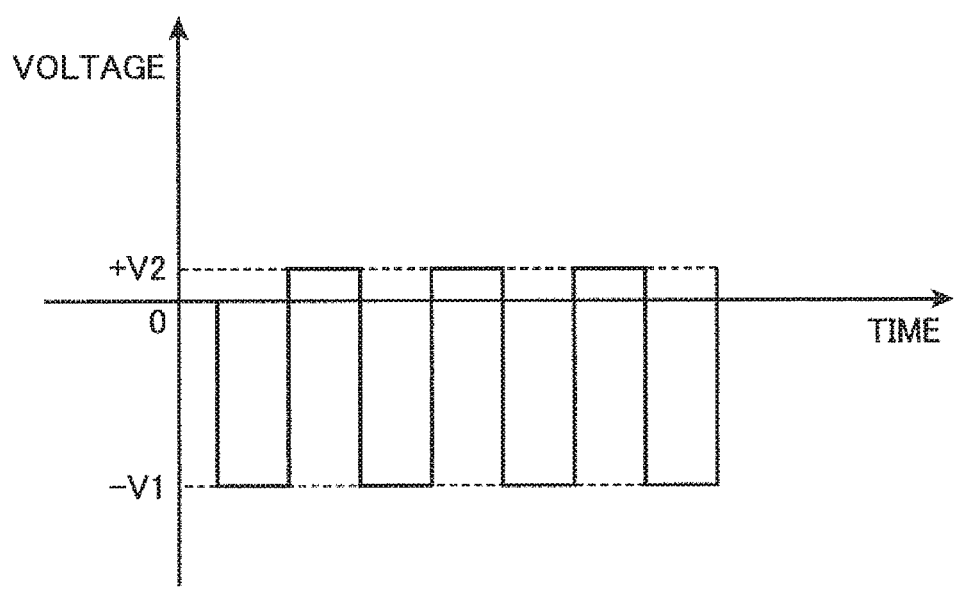
FIG. 5 is a graph showing a waveform of a bias voltage to be applied to each of the plurality of substrate holders.

With reference to FIG. 5, description will be made of a bias voltage to be applied to each of the plurality of substrate holders 16 by the bias power source 18. FIG. 5 is a graph showing the waveform of the bias voltage.

The bias power source 18 applies a negative bias voltage intermittently to each of the plurality of substrate holders 16. The bias power source 18 is a pulse power source in this embodiment.

The bias power source 18 applies a positive bias voltage when not applying a negative bias voltage in each of the etching step, the implantation step, and the film formation step. In summary, the bias power source 18 applies a negative bias voltage and a positive bias voltage alternately, to each of the plurality of substrate holders 16. The absolute value of the negative bias voltage is larger than the absolute value of the positive bias voltage.

In the case of alternately applying the negative bias voltage and the positive bias voltage as described above, the bias power source 18 may be, for example, either an alternating current power source (AC power source) or a high frequency power source (RF power source).

Figure 6:
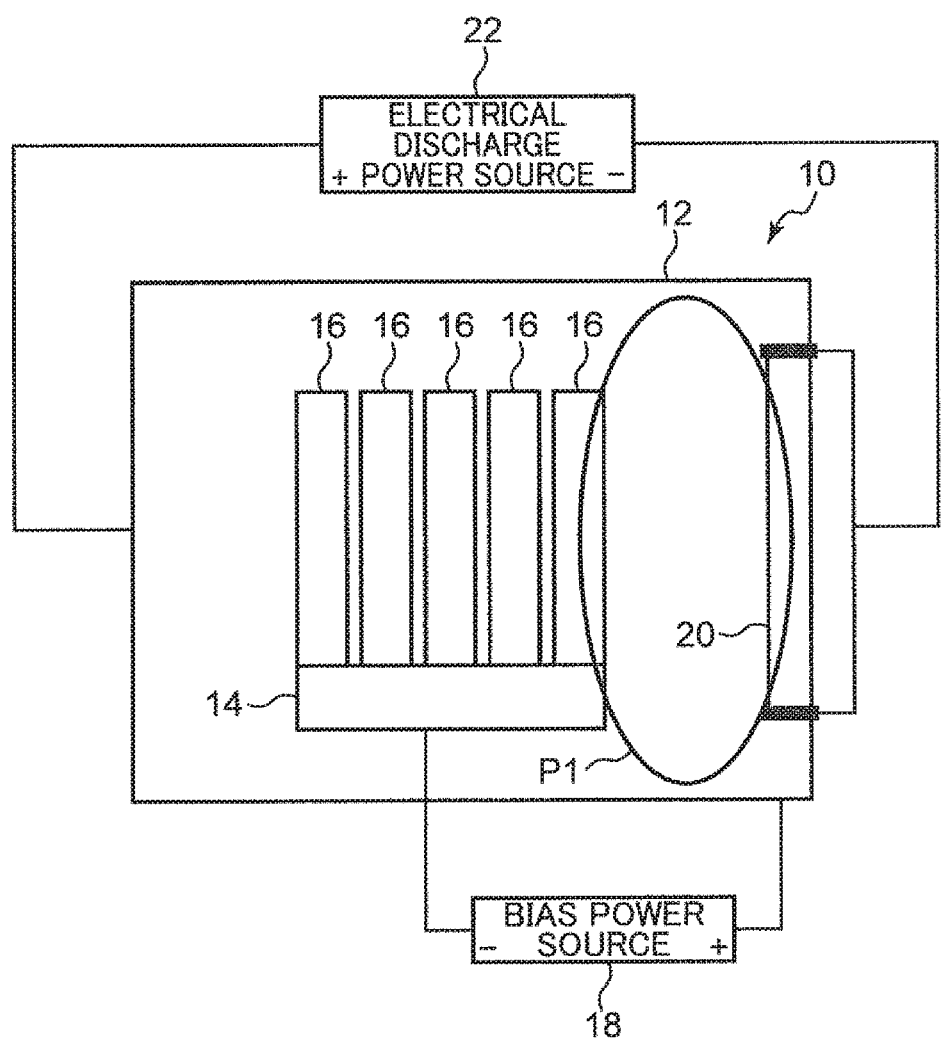
FIG. 6 is a schematic diagram showing plasma generated by glow discharge based on current application to a filament.

The plasma generation device 19 shown in FIG. 2 includes a filament 20 and an electrical discharge power source 22. The electrical discharge power source 22 applies a high voltage to the filament 20, thereby generating glow discharge. The glow discharge causes a plasma P1 of argon gas introduced into the vacuum chamber 12 ahead of the filament 20 as shown in FIG. 6. The plasma P1 includes argon ions (inert gas ions), and the negative bias voltage applied to each of the plurality of substrate holders 16 accelerates the argon ions toward the substrate holder 16 positioned in front of the filament 20. This makes it possible to bring argon ions into collision with each of the plurality of substrates 17 supported by the substrate holder 16. In FIG. 6, it is omitted to graphically show the sputtering device 23 (the evaporation source 24 and a sputtering power source 26).

The sputtering device 23 shown in FIG. 2 includes the evaporation source 24 and the sputtering power source 26.

The evaporation source 24 includes a metal target 25 and a member which supports the metal target as shown in FIG. 3 and FIG. 4. The evaporation source 24 is a magnetron sputtering source capable of generating high density plasmas ahead of the metal target 25. Particularly in the present embodiment, a magnetron sputtering source is adopted which is capable of rendering the magnetic field of an outer magnetic pole stronger than the magnetic field of an inner magnetic pole to form an unbalanced magnetic field with intentionally disrupted balance between the two magnetic fields. Hence, in the present embodiment, a sputtering is conducted based on an unbalanced magnetron sputtering method, by use of the sputtering device 23.

Figure 7:
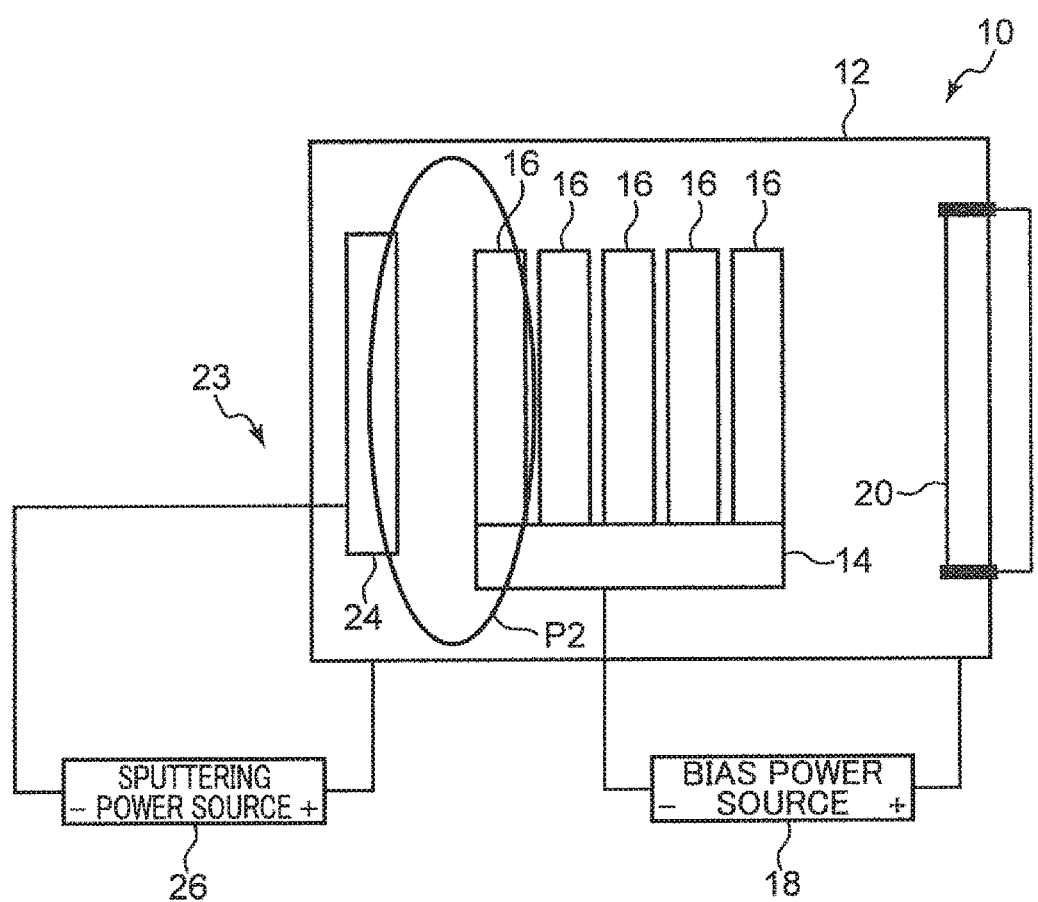
FIG. 7 is a schematic diagram showing plasma generated by glow discharge based on current application to the evaporation source.

In the sputtering device 23, the sputtering power source 26 applies a high voltage to the evaporation source 24 to thereby glow discharge. As shown in FIG. 7, the glow discharge causes a plasma P2 of the argon gas introduced into the vacuum chamber 12. In FIG. 7, it is omitted to graphically show the electrical discharge power source 22.

The plasma P2 contains argon ions (inert gas ions), a part of which is accelerated toward the metal target 25, due to the effect of a magnetic field generated by the evaporation source 24, to collide with the metal target 25. This causes metal particles (namely, sputtering particles) to sputter out of the metal target 25. The metal particles are deposited on respective surfaces of the plurality of substrates 17 supported by the substrate holder 16 positioned in front of the evaporation source 24.

The other part of the argon ions in the plasma P2 is accelerated toward the substrate holder 16 positioned in front of the evaporation source 24 by a negative bias voltage applied to each of the substrate holders 16. Thus accelerated argon ions collide with the metal particles that have sputtered out of the metal target 25 in the above-described manner and have been deposited on respective surfaces of the plurality of substrates 17, thereby implanting the metal particles into respective surfaces of the plurality of substrates 17.

The film formation device 10 further includes a not-graphically-shown film forming device. The film forming device forms a film on respective surfaces of the plurality of substrates 17. No limitation is imposed on a specific configuration of the film forming device and on a specific method for forming a film. Examples of a coating forming method include an arc ion plating method (AIP method) and an unbalanced magnetron sputtering method (DBMS method).

In the preparation step (Step S10), the plurality of substrates 17 are set in the film formation device 10 described above. Specifically, the preparation step includes having the plurality of substrates 17 supported by each of the plurality of substrate holders 16 and disposing the plurality of substrate holders 16 each supporting the plurality of substrates 17 at respective predetermined positions in the vacuum chamber 12.

With reference to FIG. 1, description will be made of steps after the preparation step (Step S10) in the film formation method according to the embodiment of the present invention step.

After the end of the preparation step (Step S10), the vacuum step (Step S11) is executed. This vacuum step is a step of maintaining the inside of the vacuum chamber 12 in vacuum or near vacuum by use of a not-graphically-shown vacuum pump. The pressure in the vacuum chamber 12 in the vacuum step is, for example, 0.0001 to 0.01 Pa.

After the end of the vacuum step, the heating step (Step S12) is executed. This heating step is a step of heating the plurality of substrates 17 supported by each of the plurality of substrate holders 16 at a predetermined temperature for a predetermined time. The temperature of each of the plurality of the substrates 17 in the heating step is, for example, 50 to 300° C. The heating time of each of the plurality of the substrates 17 in the heating step is, for example, 0.5 to 2 hours. The heating of each of the plurality of substrates 17 can be conducted also by, for example, application of a bias voltage to the plurality of substrate holders 16 by the bias power source 18.

After the end of the heating step, the etching step (Step S13) is executed. This etching step is a step of etching respective surfaces of the plurality of substrates 17 supported by each of the plurality of substrate holders 16. Specifically, the step is executed as follows.

First, argon gas is introduced into the vacuum chamber 12. The amount of the argon gas to be introduced into the vacuum chamber 12 is, for example, 50 to 200 ml/min. The pressure in the vacuum chamber 12 at this time is, for example, 0.5 to 2.0 Pa.

The argon gas is introduced into the vacuum chamber 12 while the electrical discharge power source 22 applies a high voltage to the filament 20, which generates glow discharge. The high voltage to be applied to the filament 20 is, for example, 40 to 100 V. The glow discharge causes plasma P1 of the argon gas ahead of the filament 20. The plasma P1 contains argon ions.

On the other hand, the bias power source 18 applies a negative bias voltage and a positive bias voltage, alternately, to the plurality of substrate holders 16. The application of the positive bias voltage to each of the substrate holder 16 enables positive electric charges accumulated due to the application of the negative bias voltage to the substrate holder 16 to be removed from the substrates 17. Besides the alternate applications of the negative bias voltage and the positive bias voltage makes it possible to stably bring inert gas ions into collision with the substrates 17 while suppressing accumulation of the positive electric charges caused by the application of the negative bias voltage.

The time for applying a positive bias voltage may be either the same as or different from the time for applying a negative bias voltage. The time for applying a negative bias voltage is, for example, 20 to 100 μs. The time for applying a positive bias voltage is, for example, 5 to 50 μs.

The absolute value of the negative bias voltage is preferably increased in stages. This makes it possible to suppress abnormal electrical discharge (arcing) caused by application of an abrupt voltage. It is preferable, for example, to perform applying a bias voltage of −100 V at the initial stage, applying a bias voltage of −200 V at the subsequent stage and applying a bias voltage of −300 V at the further subsequent stage (the last stage).

Respective times for applying a negative bias voltage at the plurality of stages may be equal to each other or may be different from each other.

The absolute value of the positive bias voltage is preferably smaller than the absolute value of the negative bias voltage. This makes it possible to restrict the absolute value of the positive bias voltage, which only has to remove positive electric charges, to render the difference between positive and negative bias voltages small to thereby suppress the voltage change at the time of switching of a bias voltage while effectively bringing inert gas ions into collision with the substrates 17 by application of the negative bias voltage having a large absolute value. The absolute value of the positive bias voltage is, for example, 5 to 100 V.

The case of increasing the absolute value of the negative bias voltage in stages does not require the change in the absolute value of the positive bias voltage.

In the case of increasing the absolute value of the negative bias voltage in stages, respective times for applying a positive bias voltage at the stages may be either equal to each other or different from each other.

The application of a negative bias voltage as described above causes the argon ions in the plasma P1 to be accelerated toward the substrate holder 16 positioned in front of the filament 20 and to collide with each of the plurality of the substrates 17 supported by the substrate holder 16. Respective surfaces of the plurality of the substrates 17, thus, can be etched.

The time for execution of the etching step is, for example, 10 to 30 minutes. In the case of increasing the absolute value of the negative bias voltage in stages, the execution time of each stage is, for example, 3 to 10 minutes. Respective execution times of the stages may be either equal to each other or different from each other.

After the end of the etching step, the implantation step (Step S14) is executed. This implantation step is a step of implanting metal particles (sputtering particles) into respective surfaces of the plurality of the substrates 17. Specifically, the step is executed in the following manner.

First, after the end of generation of glow discharge by voltage application to the filament 20, the sputtering power source 26 applies a high voltage to the evaporation source 24 with introduction of argon gas into the vacuum chamber 12, to generate glow discharge. The high voltage to be applied to the evaporation source 24 is, for example, 400 to 700 V.

The introduction of the argon gas into the vacuum chamber 12 may be either continued from the preceding etching step or suspended after the end of the etching step. The amount of the argon gas to be introduced into the vacuum chamber 12 may be either the same as or different from the amount of the introduction in the etching step. The pressure in the vacuum chamber 12 into which the argon gas is being introduced may be either the same as or different from the pressure in the etching step.

The glow discharge causes the plasma P2 of argon gas ahead of the metal target 25. The plasma P2 contains argon ions.

A part of the argon ions in the plasma P2 is accelerated toward the metal target 25 due to the effect of a magnetic field generated by the evaporation source 24, being brought into collision with the metal target 25. This causes metal particles (i.e., sputtering particles) to sputter out of the metal target 25. The metal particles are deposited on respective surfaces of the plurality of substrates 17 supported by the substrate holder 16 that is positioned in front of the evaporation source 24.

On the other hand, the bias power source 18 applies a negative bias voltage and a positive bias voltage, alternately, to each of the plurality of substrate holders 16. By the application of the positive bias voltage to the substrate holder 16, positive electric charges that has been accumulated due to the application of the negative bias voltage to the substrate holder 16 can be removed from the substrates 17. Besides, the alternate applications of the negative bias voltage and the positive bias voltage make it possible to stably bring inert gas ions into collision with the substrates 17 while suppressing accumulation of positive electric charges due to the application of the negative bias voltage.

The time for applying a positive bias voltage may be either the same as or different from the time for applying a negative bias voltage. The time for applying a negative bias voltage is, for example, 20 to 100 µs. The time for applying a positive bias voltage is, for example, 5 to 50 µs.

The absolute value of the positive bias voltage is preferably smaller than the absolute value of the negative bias voltage. This makes it possible to suppress the voltage change at the time of switching of a bias voltage through restriction of the absolute value of the positive bias voltage, which only has to remove positive electric charges, to render the difference between positive and negative bias voltages small while effectively bringing inert gas ions into collision with the substrates 17 by the application of the negative bias voltage having a large absolute value. The absolute value of the negative bias voltage is, for example, 80 to 1000 V. The absolute value of the positive bias voltage is, for example, 5 to 100 V.

In the implantation step, the negative bias voltage and the positive bias voltage are set to respective fixed magnitudes.

The absolute value of the negative bias voltage in the implantation step (in particular, the final stage thereof) is preferably smaller than the absolute value of the negative bias voltage in the etching step. This makes it possible to render the absolute value of the negative bias voltage in the implantation step smaller than the absolute value in the etching step to thereby prevent a substrate surface, into which metal particles are implanted, from becoming brittle, while realizing effective etching of the substrate surface by application of the negative bias voltage having a large absolute value in the etching step.

The application of the negative bias voltage as described above causes the other part of the argon ions in the plasma P2 to be accelerated toward the substrate holder 16 positioned in front of the evaporation source 24 to be brought into collision with the metal particles that has sputtered out of the metal target 25 and has been deposited on respective surfaces of the plurality of substrates 17 supported by the substrate holder 16 as described above, thereby implanting the metal particles into the respective surfaces of the plurality of substrates 17.

The time for executing such an implantation step is, for example, 3 to 30 minutes.

After the end of the implantation step, the film formation step (Step S15) is executed. The film formation step is a step of forming a film on respective surfaces of the plurality of substrates 17. The film includes an intermediate layer and a main layer. In the following, these layers will be described.

The intermediate layer is formed to cover the surface of an underlying layer that is formed of metal particles having been implanted into respective surfaces of the plurality of substrates 17 as described above. The intermediate layer has a hardness higher than the hardness of the material forming the substrate 17. The intermediate layer only needs to be capable of satisfactorily adhering to both the main layer and the underlying layer formed of metal particles implanted into the surface of the substrate 17. The intermediate layer, for example, may have both a layer capable of satisfactorily adhering to the underlying layer and a layer capable of satisfactorily adhering to the main layer.

The main layer is formed so as to cover the surface of the intermediate layer. The main layer has a hardness higher than the hardness of the intermediate layer.

Including such an intermediate layer and a main layer, the film can have a hardness which becomes higher in stages with increasing distance from the substrate 17. This makes it possible to suppress reduction in adhesion of the film to the substrate 17 due to the hardness difference (i.e., internal stress differences).

To have the intermediate layer and the main layer included in the film, the film formation step includes an intermediate layer formation step (Step S151) of forming the intermediate layer and a main layer formation step (Step S152) of forming the main layer.

The intermediate layer formation step is a step of forming the intermediate layer so that the intermediate layer covers the surface of the underlying layer formed of the metal particles implanted into the surface of the substrate 17. The main layer formation step is a step of forming the main layer so that the main layer covers the surface of the intermediate layer.

The intermediate layer and the main layer are sequentially formed in an argon gas atmosphere, for example, through an unbalanced magnetron sputtering method (UBMS method). The amount of argon gas to be introduced into the vacuum chamber 12 may be either the same as or different from the amount of argon gas to be introduced in the etching step. To form the intermediate layer and the main layer, a pulsed bias voltage is applied to each of the plurality of substrates 17. Specifically, a negative bias voltage and a positive bias voltage are alternately applied. The absolute value of the negative bias voltage is, for example, 50 to 150 V. The absolute value of the positive bias voltage is, for example, 5 to 20 V. The negative bias voltage and the positive bias voltage are set to respective fixed magnitudes.

In the ease of having a plurality of layers included in the intermediate layer, the plurality of layers are sequentially formed in the intermediate layer formation step. In the case where the underlying layer is formed of Cr, the intermediate layer preferably includes, for example, a Cr layer, a Cr/WC inclined layer, a WC layer, and a WC/C inclined layer sequentially from a side close to the underlying layer. The Cr layer is formed, for example, by use of a Cr target. The Cr/WC inclined layer is formed, for example, by use of a Cr target, a W target, and a C target. The WC layer is formed, for example, by use of a W target and a C target. The WC/C inclined layer is formed, for example, by use of a W target and a C target. The intermediate layer may further include a C layer, an Al layer, a Mo layer, a Ta layer, and a V layer. Alternatively, the intermediate layer may include at least one of these layers.

After the end of the film formation step, the cooling step (Step S16) is executed. The cooling step is a step of cooling the plurality of substrates 17 supported by each of the plurality of substrate holders 16. The cooling step can be executed, for example, by introduction of cooling gas into the vacuum chamber 12 or opening the vacuum chamber 12.

After the end of the cooling step, the plurality of substrates 17 supported by each of the plurality of substrate holders 16 are taken out from the film formation device 10. The film formation method according to this embodiment is thereby finished.

The film formation method allows the adhesion of the film to the substrates 17 to be enhanced. The reason is as follows.

The film formation method includes bringing inert gas ions into collision with the metal particles deposited on the surface of the substrate 17 to implant metal particles into the surface of the substrate 17. The implantation of the metal particles into the surface of the substrate 17 enables the interface (boundary) between the substrate 17 and a film formed on the surface thereof to be reduced as much as possible. Furthermore, the metal particles has higher affinity with the film than the affinity of the substrate 17 with the film. Thus, forming the substrate 17 on the metal particles implanted into the surface of the substrate 17 enables the adhesion of the film to the substrate 17 to be enhanced.

Figure 8:
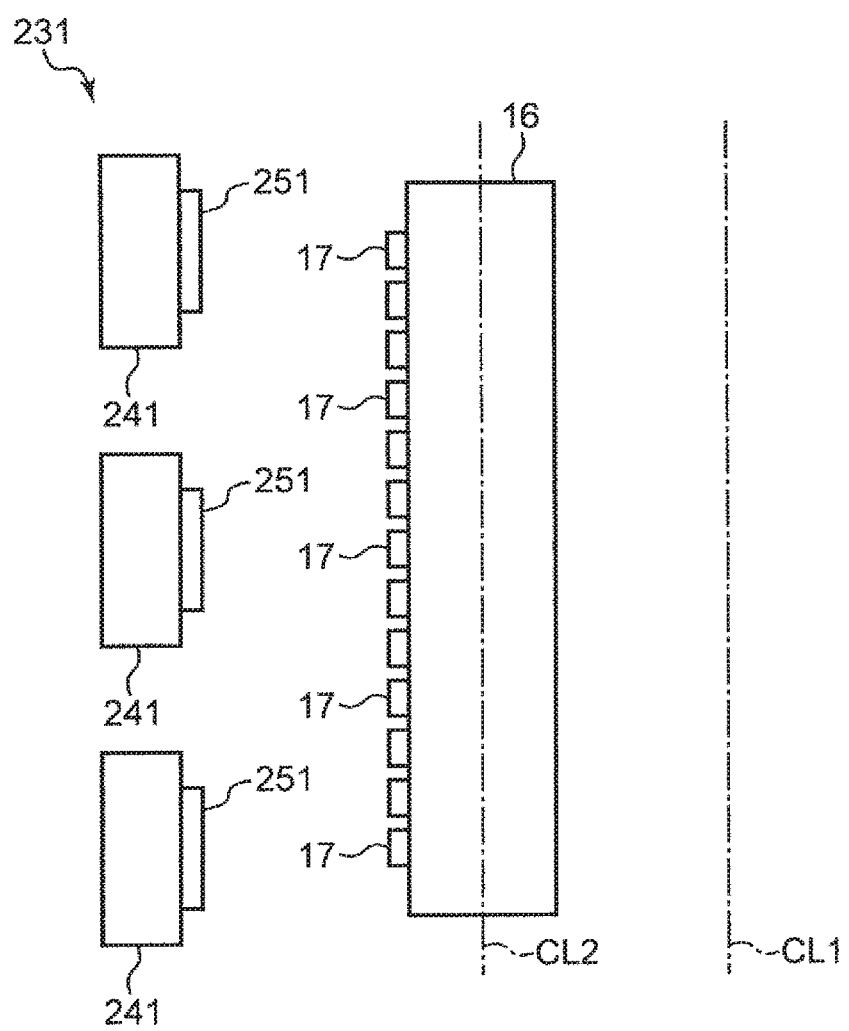
FIG. 8 is a front view of an evaporation source and a substrate holder of a film formation device according to a first modification.

FIG. 8 shows a sputtering device 231 according to a first modification of the film formation device. The sputtering device 231 according to the first modification includes a plurality of evaporation sources 241. The plurality of evaporation sources 241 are aligned in a direction in which the central axis CL2 of each of the plurality of substrate holders 16 extends (an up and down direction in FIG. 8). The plurality of evaporation sources 241 are arranged, for example, at equal intervals in the direction in which the central axis CL2 extends. Each of the plurality of evaporation sources 241 includes a metal target 251 and a member which holds the metal target 251.

Also with use of such a sputtering device 231 having the plurality of the evaporation sources 241, metal particles can be implanted into respective surfaces of the plurality of the substrates 17 supported by each of the plurality of substrate holders 16, similarly to the above embodiment.

Figure 9:
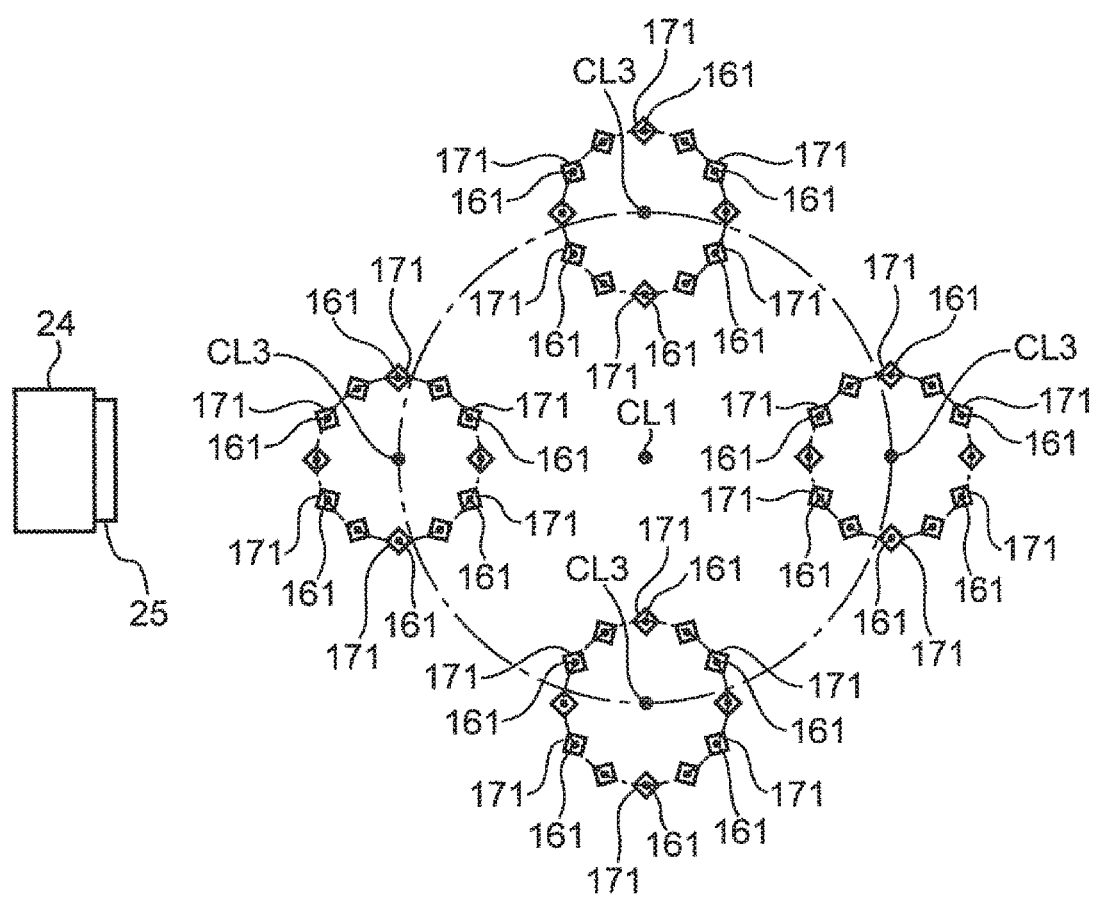
FIG. 9 is a plan view showing a plurality of substrate holders and an evaporation source of a film formation device according to a second modification.
Figure 10:
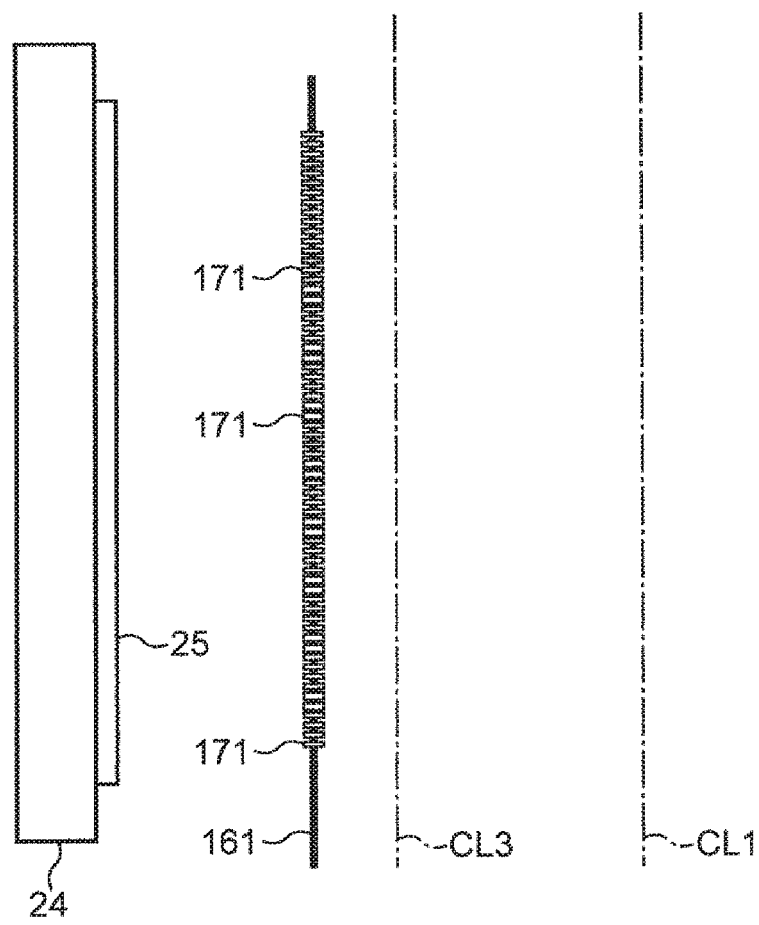
FIG. 10 is a front view showing the plurality of substrate holders and the evaporation source of the film formation device according to the second modification.
Figure 11:
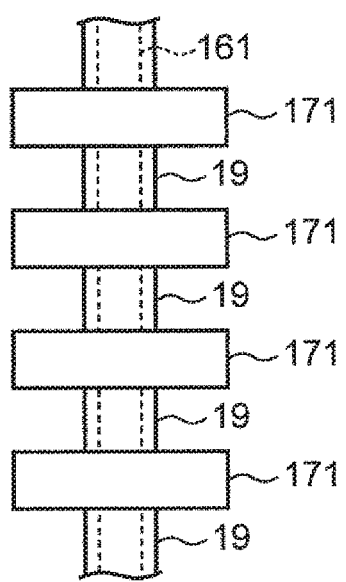
FIG. 11 is an enlarged front view showing a part of FIG. 10 in an enlarged manner.

A shape of each of the plurality of substrate holders according to the present invention can be appropriately modified in consideration of respective shapes of the plurality of substrates supported by each substrate holder. FIG. 9, FIG. 10, and FIG. 11 show a second modification of the film formation device. In this second modification, each of the plurality of substrates 17 has a through hole, and each of the plurality of substrate holders 16 has a not-graphically-shown base and a plurality of rods 161. Each of the plurality of rods 161 is formed of a conductive material and has a lower end portions supported by the base. The plurality of rods 161 are arranged at equal intervals in a circumferential direction around the central axis CL3 of the base. Each of the plurality of rods 161 is arranged in parallel to the central axis CL3. The central axis CL3 extends in parallel to the central axis CL1. The plurality of rods 161 are inserted into respective through holes of the plurality of substrates 17 so as to extend through the plurality of substrates 17. Between two substrates 17 that are included in the plurality of substrates 17 and adjacent to each other in a direction in which the rod 161 extends (an axis direction of the rod 161), a spacer 19 is provided. The spacer 19 is formed of a conductive material similarly to the rod 161. The spacer 19 prevents the two substrates 17 adjacent to each other in the direction in which the rod 161 extends (the axis direction of the rod 161) from contact with each other.

Also in the second modification, metal particles can be implanted into respective surfaces of a plurality of the substrates 171 that each of the plurality of rods 161 support similarly to the above embodiment.

Examples

Figure 12:
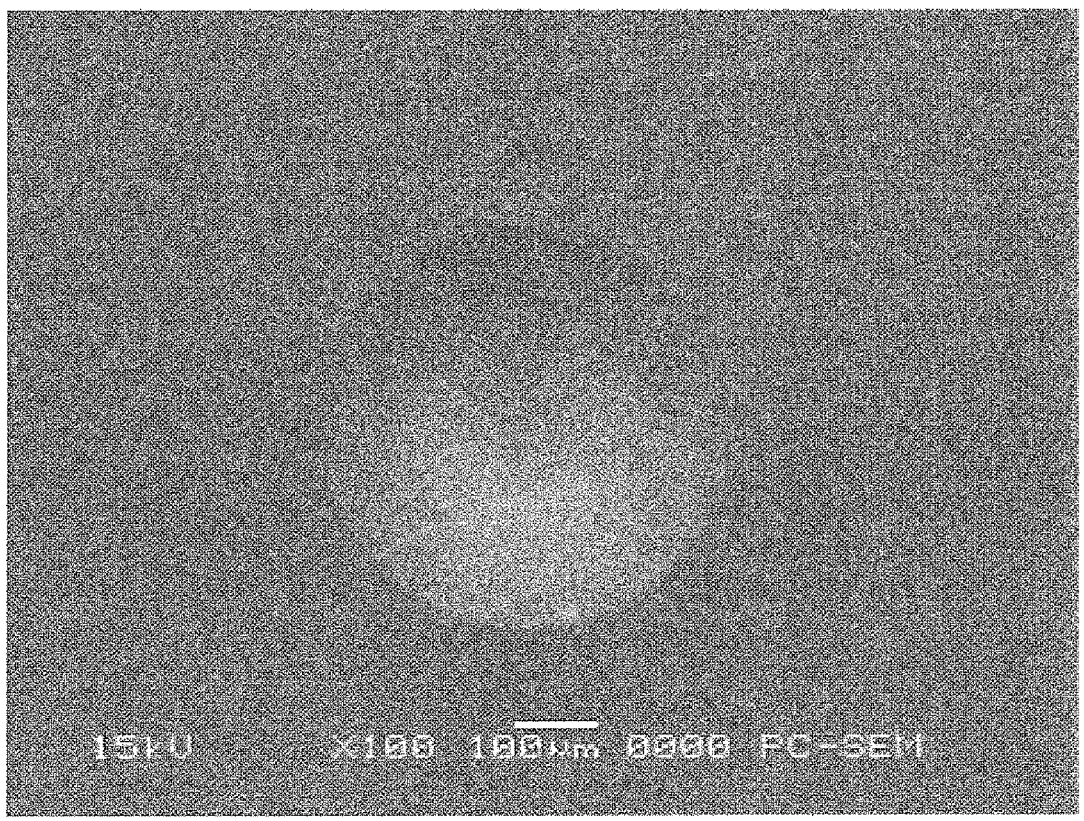
FIG. 12 is an SEM micrograph showing a state where a film has been formed on a surface of a substrate in an Example of the present invention.
Figure 13:
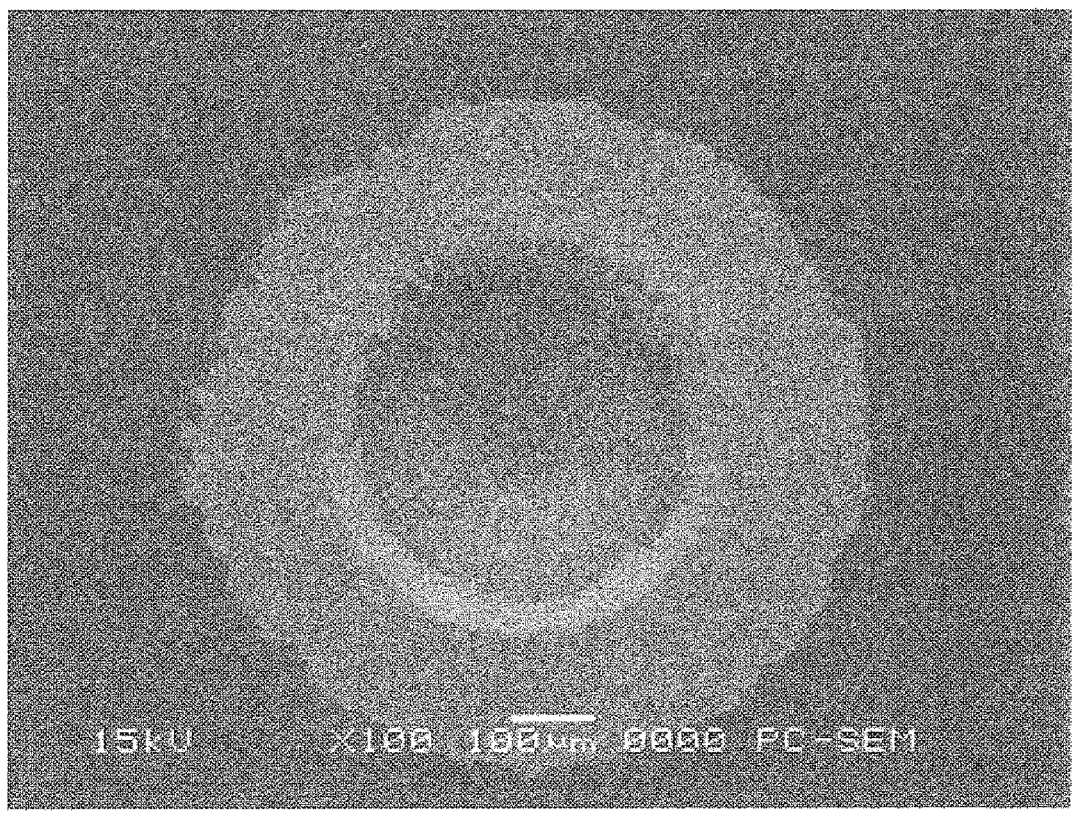
FIG. 13 is an SEM micrograph showing a state where a film has been formed on a surface of a substrate in a Comparative Example.

A Rockwell indentation test was conducted with respect to a film formed by the film formation method according to the above embodiment (Example). Specifically, performed were pressing a conical indenter against a surface of a substrate on which a film was formed by the film formation method and checking the state of indentation formed by the pressing. FIG. 12 is an SEM micrograph of the surface of the substrate after the test. For the comparison with the Example, the same test was conducted also with respect to a film formed by a film formation method including no implantation step (Comparative Example). FIG. 13 is an SEM micrograph of the surface of the substrate after the test.

The film according to the Example shown in FIG. 12 is hard to peel from a substrate as compared with the film according to the Comparative Example shown in FIG. 13. This teaches remarkable improvement of the adhesiveness of the film in the Example in comparison with the Comparative Example.

The above detailed embodiment is merely an example and the present invention should not be construed in a limited manner based on the recitation of the above-described embodiments.

In the present invention, the material of the substrate is not limited to an insulating material but may be a conductive material.

In the present invention, the mode of alternate application of a negative bias voltage and a positive bias voltage is not limited to application of such a pulsed voltage as described above. For example, also can be applied a sinusoidally changing voltage.

The implantation step according to the present invention may be started before the end of the etching step. In this case, a negative bias voltage may be gradually changed after the sputtering power source is turned ON.

As described in the foregoing, there is provided a film formation method which enables a film having a hardness higher than the hardness of a substrate to be satisfactorily adhered to the surface of the substrate. The film formation method includes: an etching step of etching the surface of the substrate by bringing inert gas ions into collision with the surface of the substrate, the inert gas ions being generated by electrical discharge with introduction of inert gas into a chamber that accommodates the substrate; an implantation step of bringing the inert gas ions into collision with metal particles, which has been deposited on the surface of the substrate, to implant the metal particles into the surface of the substrate while bringing the inert gas ions into collision with a metal target to cause metal particles to sputter out of the metal target and depositing the metal particles on the surface of the substrate that has been etched in the etching step; and a film formation step of forming the film on the surface of the substrate, into which the metal particles have been implanted.

In the above film formation method, bringing inert gas ions into collision with the metal particles deposited on the surface of the substrate through the etching step enables the metal particles to be implanted into the surface of the substrate, which reduces the interface (boundary) between the substrate and the film as much as possible. Furthermore, since the affinity of the metal particles with the film is higher than the affinity of the substrate with the film, forming the film on the metal particles having been implanted into the surface of the substrate as described above enables the film and the substrate to have improved adhesiveness to each other.

In the above film formation method, it is preferable that the substrate has insulation properties and the substrate holder has conductive properties and that, in each of the etching step and the implantation step, a negative bias voltage is applied to the substrate holder which supports the substrate in a state where a part of a surface of the substrate holder is exposed.

The application of the negative bias voltage to the substrate holder makes it possible to accelerate inert gas ions toward the substrate holder to bring a part of the inert gas ions into collision with the substrate supported by the substrate holder. This enables inert gas ions to collide with the surface of the substrate even though the substrate has insulation properties.

In the above film formation method, each of the etching step and the implantation step preferably includes stopping the application of the negative bias voltage to the substrate holder and applying a positive bias voltage.

The application of the positive bias voltage to the substrate holder enables positive electric charges accumulated due to the application of the negative bias voltage to the substrate holder to be removed from the substrate. Besides, the application of the positive bias voltage (e.g. alternate application of the negative bias voltage and the positive bias voltage or periodic application of the positive bias voltage) makes it possible to stably bring inert gas ions into collision with the substrate while suppressing accumulation of positive electric charges caused by the application of the negative bias voltage.

In the above film formation method, the absolute value of the positive bias voltage is preferably smaller than the absolute value of the negative bias voltage.

This makes it possible to suppress a voltage change at the time of switching of a bias voltage through restriction of the absolute value of the positive bias voltage, which only has to remove positive electric charges, to render the difference between positive and negative bias voltages small while effectively bringing inert gas ions into collision with the substrates by application of the negative bias voltage having the large absolute value.

In the above film formation method, the absolute value of the negative bias voltage to be applied in the implantation step is preferably smaller than the absolute value of the negative bias voltage to be applied in the etching step.

This prevents the substrate surface, into which metal particles are implanted, from becoming brittle through setting the absolute value of the negative bias voltage in the implantation step to be smaller than the absolute value in the etching step, while realizing effective etching of a substrate surface by application of the negative bias voltage having a large absolute value in the etching step.

In the above film formation method, the film formation step preferably includes an intermediate layer formation step of forming an intermediate layer constituting the film after the implantation step is conducted, and a main layer formation step of forming a main layer constituting the film together with the intermediate layer, after the intermediate layer formation step is conducted, the main layer having a hardness higher than the hardness of the intermediate layer.

Thus formed film, i.e., the film including the intermediate layer formed in the intermediate layer formation step and the main layer formed in the main layer formation step, has a hardness that increases in stages with increase in distance from the substrate, which makes it possible to restrict a hardness difference between the substrate and the film formed on the surface of the substrate and an internal stress difference corresponding to the hardness difference to thereby suppress decrease in adhesion of the film to the substrate due to an internal stress difference.

The invention claimed is:

1. A film formation method of forming a film on a surface of a substrate, the film having a hardness higher than a hardness of the substrate, the film formation method comprising:
  a preparation step of preparing a film formation device including a substrate holder to support the substrate and an evaporation source including a metal target, the substrate holder, the substrate and the evaporation source being disposed in a chamber, the evaporation source being positioned in front of the substrate;
  an etching step of applying a negative bias voltage to the substrate holder and etching the surface of the substrate by bringing inert gas ions into collision with the surface of the substrate by the negative bias voltage applied to the substrate holder, the inert gas ions being generated by electrical discharge with introduction of inert gas into the chamber;

an implantation step of applying a negative bias voltage to the substrate holder and applying voltage to the evaporation source, thereby bringing a part of the inert gas ions into collision with the metal target to cause metal particles to sputter out of the metal target by the voltage applied to the evaporation source and depositing the metal particles on the surface of the substrate that has been etched in the etching step while bringing another part of the inert gas ions into collision with metal particles by the negative bias voltage applied to the substrate holder, which has been deposited on the surface of the substrate, to implant the metal particles into the surface of the substrate, the inert gas ions being generated by another electrical discharge by the voltage applied to the evaporation source with introduction of inert gas into the chamber; and a film formation step of forming the film on the surface of the substrate, into which the metal particles have been implanted into the surface in the implantation step.

2. The film formation method according to claim 1, wherein the substrate has insulation properties and a substrate holder that supports the substrate has conductive properties, and, in each of the etching step and the implantation step, a negative bias voltage is applied to the substrate holder which supports the substrate in a state where a part of a surface of the substrate holder is exposed.

3. The film formation method according to claim 2, wherein each of the etching step and the implantation step includes stopping application of the negative bias voltage to the substrate holder and applying a positive bias voltage to the substrate holder.

4. The film formation method according to claim 3, wherein an absolute value of the positive bias voltage is smaller than an absolute value of the negative bias voltage.

5. The film formation method according to claim 3, wherein the absolute value of the negative bias voltage to be applied in the implantation step is smaller than the absolute value of the negative bias voltage to be applied in the etching step.

6. The film formation method according to claim 1, wherein the film formation step includes an intermediate layer formation step of forming an intermediate layer constituting the film after the implantation step is conducted and a main layer formation step of forming a main layer constituting the film together with the intermediate layer after the intermediate layer formation step is conducted, the main layer having a hardness higher than a hardness of the intermediate layer.

* * * * *